US012633925B2

(12) United States Patent
Kumashikar et al.

(10) Patent No.: US 12,633,925 B2
(45) Date of Patent: May 19, 2026

(54) THREE-DIMENSIONAL COLUMNAR INPUT-OUTPUT (IO) CIRCUITRY FOR INTEGRATED CIRCUIT DEVICE

(71) Applicant: Intel Corporation, Santa Clara, CA (US)

(72) Inventors: Mahesh K. Kumashikar, Bangalore (IN); Ankireddy Nalamalpu, Portland, OR (US); Atul Maheshwari, Portland, OR (US); Lai Guan Tang, Tanjung Bungah (MY)

(73) Assignee: ALTERA CORPORATION, San Jose, CA (US)

( * ) Notice: Subject to any disclaimer, the term of this patent is extended or adjusted under 35 U.S.C. 154(b) by 93 days.

(21) Appl. No.: 17/856,479

(22) Filed: Jul. 1, 2022

(65) Prior Publication Data

US 2022/0337250 A1 Oct. 20, 2022

(51) Int. Cl.
H03K 19/17736 (2020.01)
H03K 19/17728 (2020.01)
H03K 19/1776 (2020.01)

(52) U.S. Cl.
CPC . H03K 19/17744 (2013.01); H03K 19/17728 (2013.01); H03K 19/1776 (2013.01)

(58) Field of Classification Search
None
See application file for complete search history.

(56) References Cited

U.S. PATENT DOCUMENTS

| | | | |
|---|---|---|---|
| 7,518,398 B1 * | 4/2009 | Rahman | H03K 19/17796 |
| | | | 326/38 |
| 7,919,845 B2 * | 4/2011 | Karp | H01L 25/0657 |
| | | | 257/E21.705 |
| 2021/0232744 A1 * | 7/2021 | Lin | H03K 3/356113 |

* cited by examiner

*Primary Examiner* — Anh Q Tran
(74) *Attorney, Agent, or Firm* — Fletcher Yoder, PC

(57) ABSTRACT

This disclosure is directed to methods of disaggregating columnar IO operations from a programmable logic fabric using 3-D packaging technology. More specifically, methods of 3-D programmable fabric arrangements that include one or more IO chiplets stacked in a 3-D orientation on a programmable logic fabric main die that includes one or more D2D drivers to enable communication between the one or more IO chiplets and the programmable logic fabric main die. The IO chiplets may be coupled to the programmable fabric main die through connection to the one or more D2D drivers arranged on the programmable fabric main die.

20 Claims, 6 Drawing Sheets

THREE-DIMENSIONAL COLUMNAR INPUT-OUTPUT (IO) CIRCUITRY FOR INTEGRATED CIRCUIT DEVICE

BACKGROUND

The present disclosure relates generally to integrated circuit systems, such as programmable logic devices. More particularly, the present disclosure relates to three-dimensional configurations for columnar input/output (IO) circuitry.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuits are found in a wide variety of modern electronic devices. Programmable logic devices (e.g., field-programmable gate arrays (FPGAs)) are one type of integrated circuit. The programmable logic devices may be used to perform a variety of computational functions using logic circuitry distributed across a programmable logic fabric. To transfer data into and out of the programmable logic fabric, the programmable logic fabric may include input/output (IO) circuitry, which are sometimes referred to as IOs. Many IOs may be disposed on the shoreline around the programmable logic device. To further increase the IO count for the programmable logic fabric what is possible the shoreline, columnar IOs may be embedded within the programmable logic fabric. Embedding the columnar IOs in the programmable logic fabric may increase the IO count for the programmable logic fabric. However, embedding the IOs directly into the programmable logic fabric may create sizeable breaks in the fabric (e.g., 0.4 mm-1.4 mm). These breaks in the fabric created by the embedded IOs may disrupt the performance of logic operations of the fabric.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
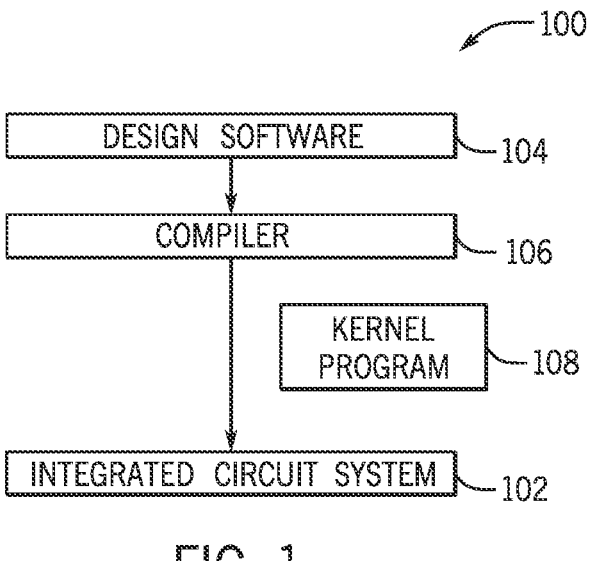
FIG. 1 is a block diagram of a process for implementing a system design on an integrated circuit system, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure describes systems and techniques related to three-dimensional (3D) configurations of columnar IOs for integrated circuit devices, such as memory devices, processors, or programmable logic fabrics, or any other integrated circuit devices that may benefit from IOs accessible from within the integrated circuit as opposed to only the shoreline. While the disclosure below refers extensively to the use of the 3D configuration of columnar IOs in the context of programmable logic devices, this structure and the associated methods and techniques may be used with any suitable integrated circuit device. Specifically, implementing IO chiplets apart from (e.g., on top of, below) the programmable logic fabric may reduce columnar IO overhead in the programmable logic fabric. Instead, IO drivers for the columnar IOs may be located on the IO chiplets to drive data out of or into the programmable fabric main die (e.g., primary die, base die). This may provide higher IO density for the programmable logic fabric, and may also enable IOs to be placed closer to the fabric without using additional area overhead of the programmable fabric main die. The IO chiplet 3D-stacked with the programmable fabric main die may enable the programmable fabric main die to no longer have to support high voltage IOs on the programmable fabric main die, which enables reduced process complexity for the programmable fabric main die. Thus, the programmable fabric main die may operate with a reduced input voltage. The IO chiplets may be located in a three-dimensional configuration below or on top of the programmable fabric main die, and may be arranged based on each of the sectors of the programmable fabric main die.

With the foregoing in mind, an integrated circuit system according to this disclosure may take any suitable form. One example is that of a programmable logic device that includes programmable logic circuitry (e.g., programmable logic fabric, FPGA). FIG. 1 illustrates a block diagram of a system 100 used to design and/or configure an integrated circuit device (e.g., a programmable logic device, an application specific integrated circuit (ASIC)). A designer may implement functionality on an integrated circuit, such as an integrated circuit system 102 that includes some reconfigurable circuitry, such as an FPGA. A designer may implement a circuit design to be programmed onto the integrated circuit system 102 using design software 104, such as a version of QUARTUS® by INTEL CORPORATION. The design software 104 may use a compiler 106 to generate a low-level circuit-design, which may be provided as a kernel program 108, sometimes known as a program object file or bitstream that programs the integrated circuit system 102. That is, the compiler 106 may provide machine-readable instructions representative of the circuit design to the integrated circuit system 102.

Figure 2:
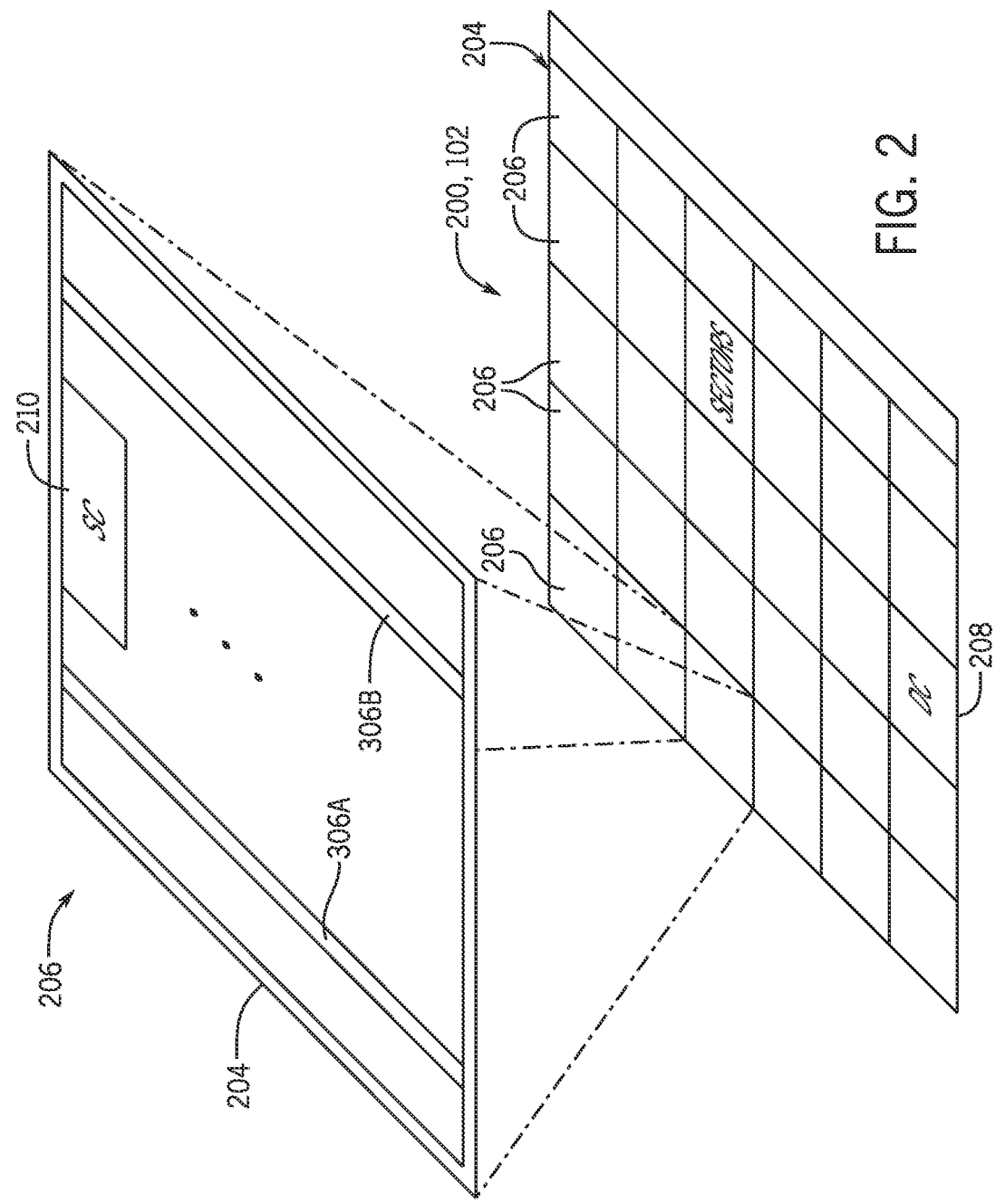
FIG. 2 is a block diagram of an example logical arrangement of the integrated circuit system in the form of a field programmable gate array (FPGA), in accordance with an embodiment of the present disclosure.

The integrated circuit system 102 may include any programmable logic device, such as a field programmable array (FPGA) 200, as shown in FIG. 2. For the purposes of this example, the FPGA 200 is referred to as a FPGA, though the device may be any suitable type of programmable logic device (e.g., an application-specific integrated circuit and/or application-specific standard product). The FPGA 200 may be formed on a single plane. Additionally or alternatively, the FPGA 200 may be a three-dimensional FPGA having a main fabric die and a supplemental fabric die. The FPGA 200 may be formed across multiple die areas that individually fall within respective reticle limits, even while the FPGA 200 as a whole may exceed one reticle limit, two reticle limits, three reticle limits, four reticle limits, or more.

In the example of FIG. 2, the FPGA 200 (e.g., programmable fabric main die) may include interconnection resources 204 that may be used to route signals, such as clock or data signals, through the FPGA 200. The FPGA 200 of FIG. 2 is sectorized, meaning that programmable logic resources may be distributed through a number of discrete programmable logic sectors 206. Each programmable logic sector 206 may include a number of programmable logic elements having operations defined by configuration memory (e.g., configuration random access memory (CRAM)). The programmable logic elements may include combinational or sequential logic circuitry. For example, the programmable logic elements may include look-up tables, registers, multiplexers, routing wires, and so forth. A designer may program the programmable logic elements to perform a variety of desired functions. A power supply may provide a source of voltage and current to a power distribution network (PDN) that distributes electrical power to the various components of the FPGA 200.

There may be any suitable number of programmable logic sectors 206 on the FPGA 200. Indeed, while 29 programmable logic sectors 206 are shown here, it should be appreciated that more or fewer may appear in an actual implementation (e.g., in some cases, on the order of 1, 5, 10, 50, 100, 500, 1000, 5000, 10,000, 50,000, or 100,000 sectors or more). Each programmable logic sector 206 may include a sector controller (SC) 210 that controls the operation of the programmable logic sector 206. Each sector controller 210 may be in communication with a device controller (DC) 208. Each sector controller 210 may accept commands and data from the device controller 208 and may read data from and write data into its configuration memory based on control signals from the device controller 208. In addition to these operations, the sector controller 210 may be augmented with numerous additional capabilities. For example, such capabilities may include locally sequencing reads and writes to implement error detection and correction on the configuration memory and sequencing test control signals to effect various test modes.

The sector controllers 210 and the device controller 208 may be implemented as state machines and/or processors. For example, each operation of the sector controllers 210 or the device controller 208 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 206. This may provide usable extensibility in an efficient and easily understood way. This may be useful because new commands could bring about large amounts of local activity within the sector at the expense of only a small amount of communication between the device controller 208 and the sector controllers 210.

Each sector controller 210 thus may communicate with the device controller 208, which may coordinate the operations of the sector controllers 210 and convey commands initiated from outside the programmable fabric main die 200. To support this communication, the interconnection resources 204 may act as a network between the device controller 208 and each sector controller 210. The interconnection resources may support a wide variety of signals between the device controller 208 and each sector controller 210. In one example, these signals may be transmitted as communication packets.

The programmable fabric main die 200 may include one or more die-to-die (D2D) drivers 306A, 306B that may be connected to one or more chiplets in a three-dimensional orientation above the programmable fabric main die 200. The D2D drivers 306A, 306B may be thin in area (e.g., e 0.1-1.0 microns in area) within the programmable fabric main die 200, as to not disrupt the flow of logic within and between the logic sectors 206 of the programmable fabric main die 200. The D2D drivers 306A, 306B may be positioned according to the logic sector 206 bandwidth, and may be positioned to correspond to logic sectors 206 that have high data flow relative to other logic sectors 206 within the programmable fabric main die 200. Moreover, the D2D drivers 306A, 306B may be embedded amid the programmable logic fabric resources rather than be concentrated only along the shoreline of the programmable fabric main die 200, thereby avoiding bandwidth and routing bottlenecks. While only two strips of D2D drivers 306A, 306B are shown, any suitable number may be included.

The FPGA 200 may be electrically programmed. With electrical programming arrangements, the programmable elements may include one or more logic elements (wires, gates, registers, etc.). For example, during programming, configuration data is loaded into the configuration memory using pins and input/output circuitry. In one example, the configuration memory may be implemented as configuration random-access-memory (CRAM) cells. In some embodiments, the configuration data may be loaded into the FPGA 200 using an update to microcode of a processor in which the FPGA 200 is embedded. The use of configuration memory based on RAM technology is described herein is intended to be only one example. Moreover, configuration memory may be distributed (e.g., as RAM cells) throughout the various programmable logic sectors 206 the FPGA 200. The configuration memory may provide a corresponding static control output signal that controls the state of an associated programmable logic element or programmable component of the interconnection resources 204. The output signals of the configuration memory may be applied to the gates of metal-oxide-semiconductor (MOS) transistors that control the states of the programmable logic elements, or programmable components of the interconnection resources 204.

As discussed above, the FPGA 200 (e.g., programmable logic fabric) in some embodiments, may include a three-dimensional (3-D) stacked orientation of architecture components. In some embodiments, the 3-D arrangement may include a programmable fabric main die that may include the one or more programmable logic sectors 206 and one or more IO chiplets that may be coupled above or below the programmable fabric main die to implement columnar IOs without disrupting the programmable logic fabric function. The ability for one or more IO chiplets to be 3-D stacked with the programmable fabric main die enables columnar IO operations without implementing large breaks in the programmable logic fabric or creating latency in processing by placing all columnar IOs on the shoreline (e.g., periphery edges) of the programmable logic fabric.

Figure 3:
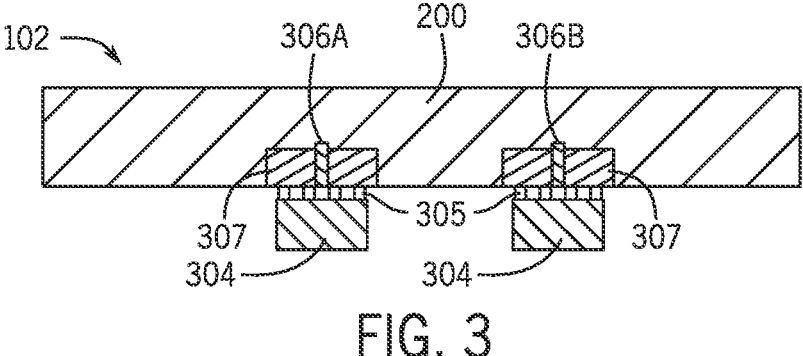
FIG. 3 is a schematic diagram of a side-view of a three-dimensional configuration of a programmable logic fabric with columnar input/output (IO) capabilities, in accordance with an embodiment of the present disclosure.

Keeping the foregoing in mind, FIG. 3 is a schematic diagram of a side-view of a three-dimensional configuration of a 3-D programmable fabric-based package 300 with columnar input/output (IO) capabilities, in accordance with an embodiment of the present disclosure. As discussed above, the columnar IO function may be implemented by a 3-D arrangement of one or more IO chiplets 304 that include one or more IO drivers coupled at one or locations directly above or below a programmable fabric main die 200. The 3-D programmable fabric-based package 300 may include the programmable fabric main die 200 that may include one or more D2D drivers 306A, 306B, one or more programmable logic sectors 206, and one or more IO chiplets 304 that are three-dimensionally stacked and coupled to the top or bottom of the programmable fabric main die 200. The programmable fabric main die 200 may be an FPGA-like fabric that includes router resource components and programmable logic components. The programmable fabric main die 200 may itself be 3-D stacked on other dies or may include IO chiplets 304 on different (or both) sides of the programmable fabric main die 200.

The D2D drivers 306A, 306B that connect the IO chiplets 304 to the programmable fabric main die 200 in any orientation and/or amount based on the IO chiplet 304 placement and logic placement within the programmable fabric main die 200. The IO chiplets 304 may be disaggregated from the programmable fabric main die 200 using three-dimensional packaging technology (e.g., Foveros Omni® by INTEL CORPORATION, 2.XD-like FO-EB from SPIL). Using such three-dimensional packaging technology, the 3-D stacked programmable fabric 300 may be implemented by embedding the IO chiplets 304 into a chip mold. The IO chiplets 304 may have through-silicon via (TSV) vertical interconnect access and copper pillars to couple the IO chiplets 304 directly to the top or bottom of the programmable fabric main die 200 using microbumps 305 or hybrid bonds to create the three-dimensional configuration.

Because the D2D drivers 306 may not take up the entire thickness of the programmable fabric main die 200, the programmable logic fabric resources may be contiguous over the D2D drivers 306, whereas if the IO resources were embedded they would interrupt the programmable logic fabric resources. This allows for more contiguous programmable logic device system designs (e.g., bitstreams). Moreover, the IO chiplets 304 may be substantially larger than the D2D drivers 306 to accommodate any suitable IO driving circuitry to drive or receive signals out of the package of the integrated circuit system 102. Because the IO driving circuitry has been disaggregated into the separate IO chiplets 304, the IO driving circuitry does not take up valuable space in the programmable logic fabric resources of the programmable fabric main die 200. Moreover, the IO chiplets 304 may be formed using a different process node than the programmable fabric main die 200. In this way, the analog IO driving circuitry of the IO chiplets 304 may be designed for a particular process node that may better support analog circuits and the digital circuitry of the programmable fabric may be designed for a different process node that may better support digital circuitry. In addition, it may be beneficial to more rapidly scale the programmable fabric main die 200 to smaller and smaller process nodes as they become available, but it may be beneficial not to redesign the analog IO circuitry for the same smaller process nodes with every iteration of the programmable fabric main die 200.

Any suitable configuration of IO chiplets 304 may be implemented to attach to the programmable fabric main die 200. The microbumps 305 or hybrid bonds may create an interface between the IO chiplets 304 and the programmable fabric main die 200. The microbumps 305 or hybrid bonds may be coupled to a micro-bump field 307 that may align the IO chiplet 304 with the D2D drivers 306A, 306B. This may enable the IO chiplet 304 to receive data from the D2D drivers and offload to the IO chiplets 304. The micro-bump field 307 may include the microbumps 305 or hybrid bonds, certain memory and/or IO components, SDM, or XCVR components. The micro-bump field 307 may include the microbumps 305 or hybrid bonds patterned throughout. The micro-bump field 307 may include one or more strips of certain memory and/or IO components to receive or transmit signals from the microbumps 305 or hybrid bonds. The micro-bump field 307 may also include a die-to-die diffusion locations for signal transfer from the IO chiplets 304 to the programmable fabric main die 200. Any suitable connection interface may be implemented to connect the IO chiplets 304 to the programmable fabric main die 200.

Figure 4:
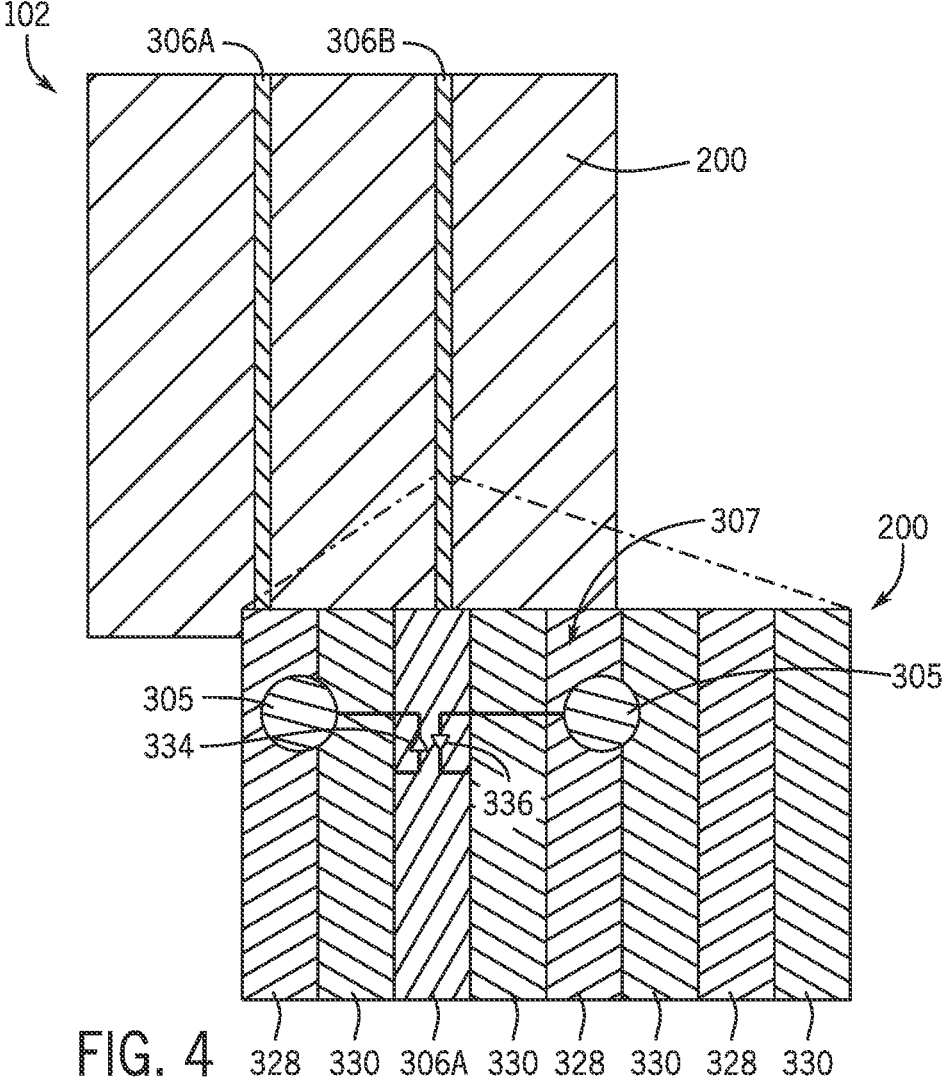
FIG. 4 is a schematic diagram of the programmable logic fabric of FIG. 3, with a vertical columnar IO configuration, in accordance with an embodiment of the present disclosure.

Keeping the foregoing in mind, FIG. 4 is a schematic diagram of a portion of the programmable fabric main die 200 with a vertical columnar IO configuration, in accordance with an embodiment of the present disclosure. The programmable fabric main die 200 may include one or more D2D drivers 306A, 306B and one or more programmable logic sectors. For example, the programmable fabric main die 200 may include a first vertical D2D driver 306A and a second vertical D2D driver 306B that stretch from a bottom of the programmable fabric main die 200 to the top of the programmable fabric main die 200 or that stretch across at least part of the programmable fabric main die 200. The first vertical D2D driver 306A and the second vertical D2D driver 306B may facilitate communication between the programmable fabric main die 200 logic and the one or more IO chiplets 304 that may be 3-D stacked on the programmable fabric main die 200. The D2D drivers 306A, 306B may include any suitable signal driving circuitry and/or signal receiving circuitry to communicate signals over the microbumps 305 or hybrid bonds to or from the IO chiplets 304.

The first vertical D2D driver 306A and the second vertical D2D driver 306B may be thin in area (e.g., 0.1-1.0 square microns in area or smaller) compared to embedded columnar IOs in traditional programmable logic fabric configurations. The first vertical D2D driver 306A and the second vertical D2D driver 306B may each be connected to the one or more IO chiplets 304 located on top of the programmable fabric main die 200 in a 3-D configuration. The vertical D2D drivers 306A, 306B located in the programmable logic main die 302 may route data from one or more sectors 206 of the programmable logic fabric to one or more IO chiplets 304 that may be connected to the two vertical D2D drivers 306A, 306B. It should be understood that although two vertical D2D drivers 306A, 306B are discussed above, any suitable number of vertical D2D drivers 306A, 306B and/or IO chiplets 304 may be utilized to create the three-dimensional programmable fabric 300.

The vertical D2D drivers 306A, 306B may be vertical in relation to other columns of programmable resources of the programmable fabric main die 200. For example, the vertical D2D drivers 306A, 306B may be parallel to logic array block (LAB) columns 328 and routing (RT) columns 330. The vertical D2D drivers 306A, 306B may include an array of driver circuits 334 that respectively send signals to one of the IO chiplets 304 and an array of receiver circuits 336 that respectively receive data from one of the IO chiplets 304 by way of different microbumps 305 or hybrid bonds of the micro-bump field 307.

Figure 5:
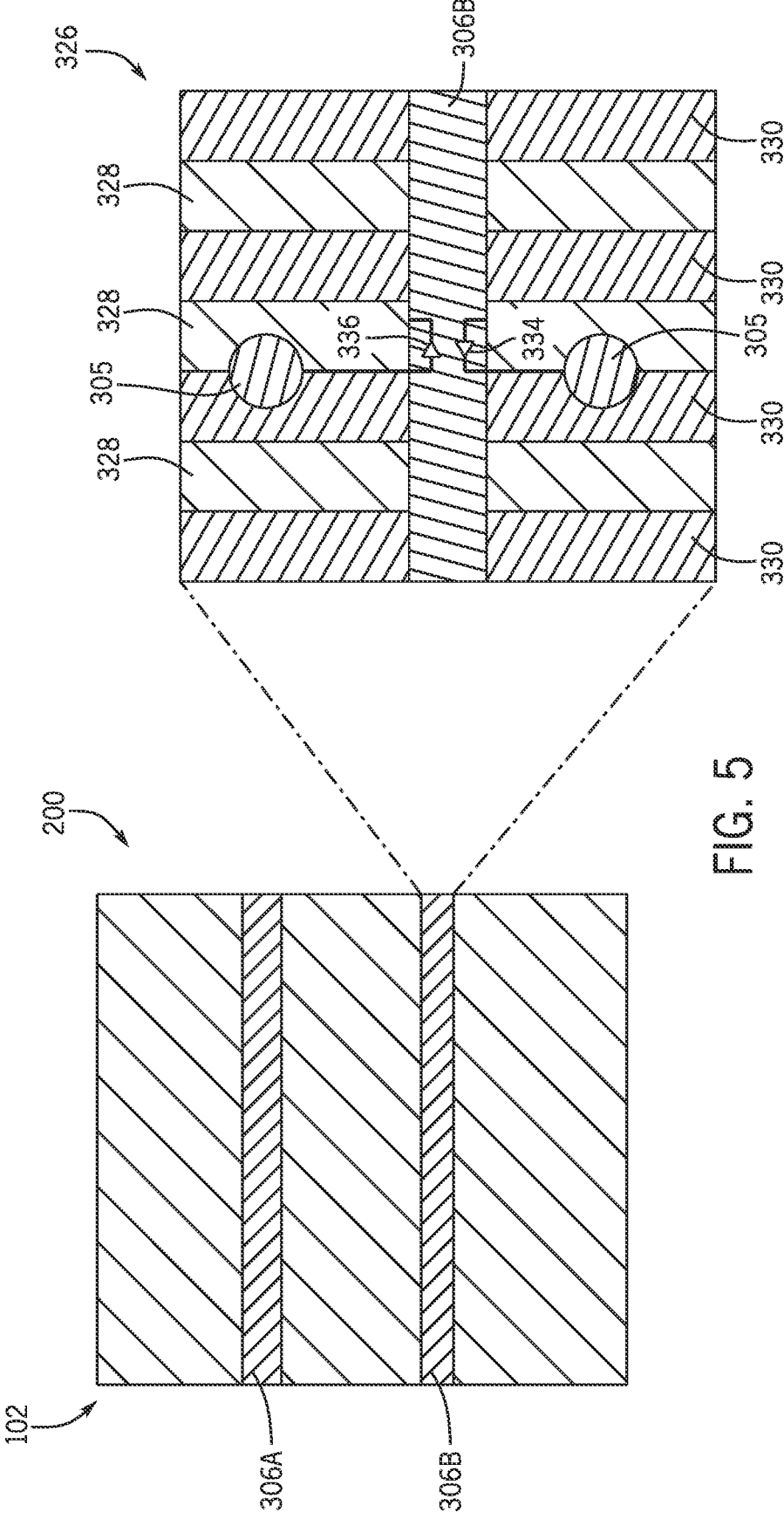
FIG. 5 is a schematic diagram of the programmable logic fabric of FIG. 3, with a horizontal columnar IO configuration, in accordance with an embodiment of the present disclosure.

The D2D driver configuration on the programmable fabric main die 200 may be any suitable configuration based on logic sectors 206 of the programmable fabric, or any other suitable factors. For example, FIG. 5 is a schematic diagram of the programmable logic fabric 302 with a horizontal columnar IO configuration, in accordance with an embodiment of the present disclosure. The programmable fabric main die 200 may include one or more D2D drivers 308A, 308B and one or more programmable logic sectors 206. For example, the programmable fabric main die 200 may include a first horizontal D2D driver 306A and a second horizontal D2D driver 308B that stretch from a bottom of the programmable fabric main die 200 to the top of the programmable fabric main die 200. The first horizontal D2D driver 306A and the second horizontal D2D driver 306B may facilitate communication between the programmable fabric main die 200 logic and the one or more IO chiplets 304 that may be 3-D stacked on the programmable fabric main die 200. The D2D drivers 306A, 306B that connect to and route logic to and/or from the IO chiplets 304 to the programmable fabric main die 200 may be in a horizontal columnar orientation that runs across the entire programmable fabric main die 200 or across one or more segments of the programmable fabric main die 200.

As discussed above, similar to the vertical D2D drivers 306A, 306B, the horizontal D2D drivers 306A, 306B may be thin in area (e.g., 0.1-1.0 square microns in area or smaller) compared to embedded columnar IOs in traditional programmable logic fabric configurations. The first horizontal D2D driver 306A and the second horizontal D2D driver 306B may each be connected to the one or more IO chiplets

304 located on top of the programmable fabric main die 200 in a three-dimensional configuration. The IO chiplets 304 may include one or more IO drivers to enable columnar IO functionality without disrupting the logic and routing within the programmable fabric. The horizontal D2D drivers 306A, 306B located in the programmable logic main die 200 may route data from one or more sectors 206 of the programmable logic fabric to one or more IO chiplets 304 that may be connected to the horizontal D2D drivers 306A, 306B. It should be understood that although horizontal D2D drivers 306A, 306B are discussed above, any suitable number of horizontal D2D drivers 306A, 306B and/or IO chiplets 304 may be utilized to create the three-dimensional programmable fabric 300.

The horizontal D2D drivers 306A, 306B may be horizontal in relation to other columns of programmable resources of the programmable fabric main die 200. For example, the horizontal D2D drivers 306A, 306B may be perpendicular to logic array block (LAB) columns 328 and routing (RT) columns 330. The vertical D2D drivers 306A, 306B may include the array of driver circuits 334 that respectively send signals to one of the IO chiplets 304 and the array of receiver circuits 336 that respectively receive data from one of the IO chiplets 304 by way of different microbumps 305 or hybrid bonds of the micro-bump field 307.

Figure 6:
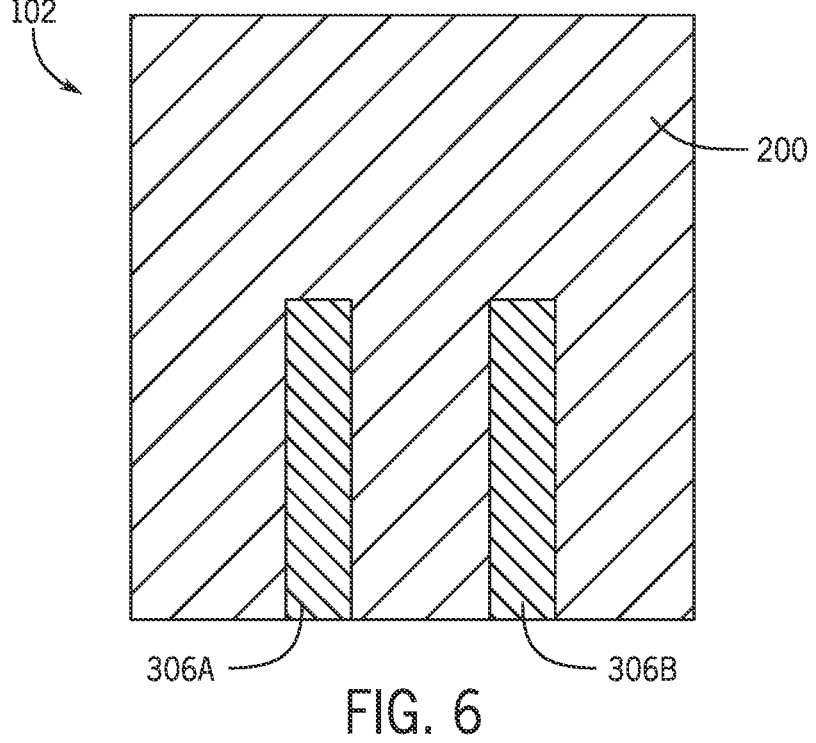
FIG. 6 is a schematic diagram of the programmable logic fabric of FIG. 3, with a partial vertical columnar IO configuration, in accordance with an embodiment of the present disclosure.

With the foregoing in mind, FIG. 6 is a schematic diagram of the three-dimensional configuration of the programmable logic fabric 300, with a partial vertical columnar IO configuration, in accordance with an embodiment of the present disclosure. In some embodiments the D2D drivers 306A, 306B within the programmable fabric main die 200 may be concentrated to certain programmable logic sectors 206 and may not run the entire length of the programmable fabric main die 200. This may enable resources to be concentrated at the programmable logic sectors that need excess routing resources and/or access to the IO chiplets 304.

The first partial vertical D2D driver 306A and the second partial vertical D2D driver 306B may each be connected to the one or more IO chiplets 304 located on top of the programmable fabric main die 200 in a three-dimensional configuration. The IO chiplets 304 may include one or more IO drivers to enable columnar IO functionality without disrupting the logic and routing within the programmable fabric. The first partial vertical D2D driver 306A and the second partial vertical D2D driver 306B located in the programmable fabric main die 200 may route data from one or more sectors 206 of the programmable logic fabric to one or more IO chiplets 304 that may be connected to the first partial vertical D2D driver 306A and the second partial vertical D2D driver 306B. The first partial vertical D2D driver 306A and the second partial vertical D2D driver 306B may be placed within areas of the programmable fabric main die 200 based on the logic within the one or more sectors 206. The partial vertical D2D drivers 306A, 306B embedded within the programmable fabric main die 200 may include any number of vertical D2D drivers 306A, 306B that may run any length of the programmable fabric main die 200 (e.g., based on the logic included in each sector of the programmable fabric main die 200). For example, logic sectors 206 that correspond to a greater bandwidth of data transfer may be closer to the partial vertical D2D drivers 306A, 306B than other logic sectors 206 that correspond to lower data transfer amounts.

Figure 7:
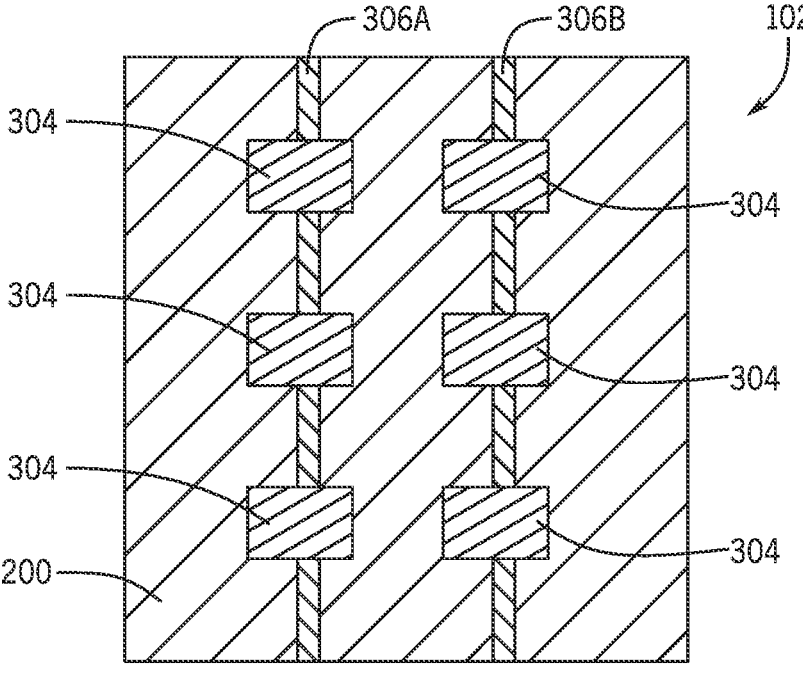
FIG. 7 is a schematic diagram of a top view of the three-dimensional vertical configuration of the programmable logic fabric with columnar input/output (IO) chiplets, in accordance with an embodiment of the present disclosure.

Keeping the foregoing in mind, FIG. 7 is a schematic diagram of a top view of the three-dimensional vertical configuration of the programmable logic fabric with columnar input/output (IO) chiplets, in accordance with an embodiment of the present disclosure. As discussed above, one or more IO chiplets 304 that include large IO drivers (e.g., 0.4 mm-1.4 mm in width) to drive communications out of programmable fabric main die 200 to the IO chiplets 304. The number of IO chiplets used may vary depending on the logic included in the programmable fabric main die 200. The IO chiplets 304 may be 3-D stacked onto sections of the programmable fabric main die 200 to couple the IO chiplets to the one or more D2D drivers of the programmable fabric main die 200. The IO chiplets 304 may be placed along the entire length of the D2D drivers embedded within the programmable fabric main die 200 or may be placed at certain locations of the D2D drivers based on logic needs of the one or more sectors of the programmable fabric main die 200.

Figure 8:
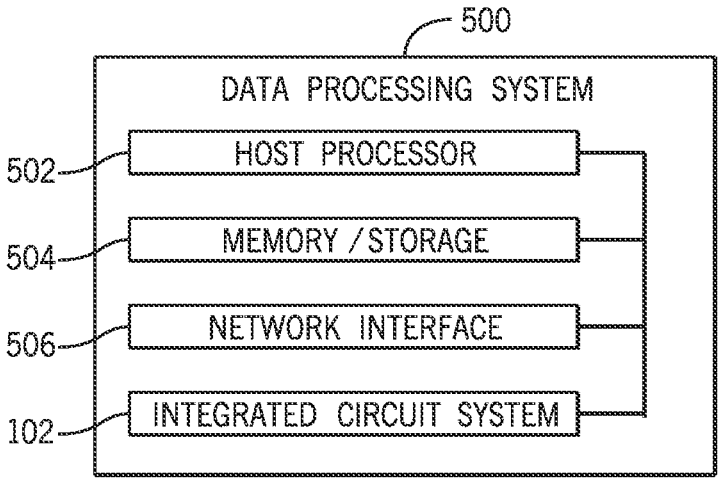
FIG. 8 is a block diagram of a three-dimensional configuration of a programmable logic fabric with columnar input/output (IO) capabilities, in accordance with an embodiment of the present disclosure.

Bearing the foregoing in mind, the integrated circuit system 102 may be a component included in a data processing system, such as a data processing system 500, shown in FIG. 8. The data processing system 500 may include the integrated circuit system 102 (e.g., a programmable logic device with chiplet packages), a host processor 502, memory and/or storage circuitry 504, and a network interface 506. The data processing system 500 may include more or fewer components (e.g., electronic display, user interface structures, application specific integrated circuits (ASICs)). The host processor 502 may include any suitable processors that may manage a data processing request for the data processing system 500 (e.g., to perform encryption, decryption, machine learning, video processing, voice recognition, image recognition, data compression, database search ranking, bioinformatics, network security pattern identification, spatial navigation, cryptocurrency operations, or the like). The memory and/or storage circuitry 504 may include random access memory (RAM), read-only memory (ROM), one or more hard drives, flash memory, or the like. The memory and/or storage circuitry 504 may hold data to be processed by the data processing system 500. In some cases, the memory and/or storage circuitry 504 may also store configuration programs (bitstreams) for programming the integrated circuit system 102. The network interface 506 may allow the data processing system 500 to communicate with other electronic devices.

The data processing system 500 may include several different packages or may be contained within a single package on a single package substrate. For example, components of the data processing system 500 may be located on several different packages at one location (e.g., a data center) or multiple locations. For instance, components of the data processing system 500 may be located in separate geographic locations or areas, such as different cities, states, or countries. In one example, the data processing system 500 may be part of a data center that processes a variety of different requests. For instance, the data processing system 500 may receive a data processing request via the network interface 506 to perform encryption, decryption, machine learning, video processing, voice recognition, image recognition, data compression, database search ranking, bioinformatics, network security pattern identification, spatial navigation, digital signal processing, or other specialized tasks.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS

EXAMPLE EMBODIMENT 1. A system comprising: one or more input/output (IO) chiplets; a programmable fabric main die, wherein the one or more IO chiplets are stacked in a three-dimensional orientation above or below the programmable fabric main die, and wherein the programmable fabric main die comprises: one or more die-to-die (D2D) drivers embedded within the fabric main die, wherein the one or more D2D drivers interface with the one or more IO chiplets.

EXAMPLE EMBODIMENT 2. The system of example embodiment 1, wherein the one or more D2D drivers are embedded into the programmable fabric main die in a vertical configuration in relation to vertical interconnection resources of the programmable fabric main die from a bottom edge of the programmable fabric main die to a top edge of the programmable fabric main die.

EXAMPLE EMBODIMENT 3. The system of example embodiment 1, wherein the one or more D2D drivers are embedded into the programmable fabric main die in a horizontal configuration in relation to vertical interconnection resources of the programmable fabric main die from a left edge of the programmable fabric main die to a right edge of the programmable fabric main die.

EXAMPLE EMBODIMENT 4. The system of example embodiment 1, wherein the one or more IO chiplets are coupled to the programmable fabric main die at one or more locations corresponding to the one or more D2D driver locations on the programmable fabric main die.

EXAMPLE EMBODIMENT 5. The system of example embodiment 1, wherein the one or more IO chiplets comprise IO drivers that are larger than the one or more D2D drivers.

EXAMPLE EMBODIMENT 6. The system of example embodiment 1, wherein the one or more IO chiplets comprise through silicon vias (TSVs) and copper pillars, wherein the through silicon vias (TSVs) and copper pillars connect via one or more connection interfaces to the programmable fabric main die, to couple the programmable fabric main die to the one or more IO chiplets.

EXAMPLE EMBODIMENT 7. The system of example embodiment 1, wherein the programmable fabric main die comprises a field-programmable gate array (FPGA).

EXAMPLE EMBODIMENT 8. The system of example embodiment 1, wherein the programmable logic fabric main die comprises a plurality of sectors associated with logic of the programmable fabric main die.

EXAMPLE EMBODIMENT 9. The system of example embodiment 8, wherein a location of the one or more D2D driver within the programmable fabric main die is based on the logic of the sector of the one or more sectors, wherein one or more sectors are connected to a greater number of IO chiplets than one or more additional sectors.

EXAMPLE EMBODIMENT 10. A programmable fabric main die, wherein one or more IO chiplets are stacked in a three-dimensional orientation above or below the programmable fabric main die, and wherein the programmable fabric main die comprises: one or more die-to-die (D2D) drivers embedded within the fabric main die, wherein the one or more D2D drivers interface with the one or more IO chiplets.

EXAMPLE EMBODIMENT 11. The programmable fabric main die of example embodiment 1, wherein the one or more IO chiplets comprise IO drivers that are larger than the one or more D2D drivers.

EXAMPLE EMBODIMENT 12 The programmable fabric main die of example embodiment 1, wherein the one or more D2D drivers are embedded into the programmable fabric main die in a vertical configuration in relation to vertical interconnection resources of the programmable fabric main die.

EXAMPLE EMBODIMENT 13. The programmable fabric main die of example embodiment 1, wherein the one or more D2D drivers are embedded into the programmable fabric main die in a horizontal configuration in relation to vertical interconnection resources of the programmable fabric main die.

EXAMPLE EMBODIMENT 14. The programmable fabric main die of example embodiment 1, wherein the one or more D2D drivers interface with the one or more IO chiplets via a plurality of microbumps or hybrid bonds.

EXAMPLE EMBODIMENT 15. An integrated circuit comprising: one or more input/output (IO) chiplets; a programmable fabric main die, wherein the one or more IO chiplets are stacked in a three-dimensional orientation above or below the programmable fabric main die, and wherein the programmable fabric main die comprises: one or more die-to-die (D2D) drivers embedded within the fabric main die, wherein the one or more D2D drivers interface with the one or more IO chiplets.

EXAMPLE EMBODIMENT 16. The integrated circuit of example embodiment 15, wherein the programmable fabric main die does not include IO resources within the programmable fabric main die.

EXAMPLE EMBODIMENT 17. The integrated circuit of example embodiment 15, wherein the programmable fabric main die does include IO resources within the programmable fabric main die.

EXAMPLE EMBODIMENT 18. The integrated circuit of example embodiment 15, wherein the one or more D2D drivers are less than 1.0 square microns in area.

EXAMPLE EMBODIMENT 19. The integrated circuit of example embodiment 15, wherein the programmable logic fabric main die comprises a plurality of sectors associated with logic of the programmable fabric main die.

EXAMPLE EMBODIMENT 20. The system of example embodiment 19, wherein a location of the one or more D2D driver within the programmable fabric main die is based on the logic of the sector of the one or more sectors, wherein one or more sectors are connected to a greater number of IO chiplets than one or more additional sectors.

What is claimed is:

1. A system comprising:
one or more input/output (IO) chiplets;
a programmable fabric main die, wherein the one or more IO chiplets are stacked in a three-dimensional orientation above or below the programmable fabric main die, and wherein the programmable fabric main die comprises:
one or more die-to-die (D2D) drivers embedded within the programmable fabric main die, wherein the one or more D2D drivers interface with the one or more IO chiplets; and
a plurality of sectors associated with logic of the programmable fabric main die, wherein a location of the one or more D2D drivers within a sector of the plurality of sectors of the programmable fabric main die is based on logic of the sector of the plurality of sectors.

2. The system of claim 1, wherein the one or more D2D drivers are embedded into the programmable fabric main die in a vertical configuration in relation to vertical interconnection resources of the programmable fabric main die from a bottom edge of the programmable fabric main die to a top edge of the programmable fabric main die.

3. The system of claim 1, wherein the one or more D2D drivers are embedded into the programmable fabric main die in a horizontal configuration in relation to vertical interconnection resources of the programmable fabric main die from a left edge of the programmable fabric main die to a right edge of the programmable fabric main die.

4. The system of claim 1, wherein the one or more IO chiplets are coupled to the programmable fabric main die at one or more locations corresponding to the location of the one or more D2D drivers on the programmable fabric main die.

5. The system of claim 1, wherein the one or more IO chiplets comprise IO drivers that are larger than the one or more D2D drivers.

6. The system of claim 1, wherein the one or more IO chiplets comprise through silicon vias (TSVs) and copper pillars, wherein the through silicon vias (TSVs) and copper pillars connect via one or more connection interfaces to the programmable fabric main die, to couple the programmable fabric main die to the one or more IO chiplets.

7. The system of claim 1, wherein the programmable fabric main die comprises a field-programmable gate array (FPGA).

8. The system of claim 1, wherein the programmable fabric main die comprises a plurality of sectors associated with logic of the programmable fabric main die.

9. The system of claim 8, wherein some sectors of the plurality of sectors are connected to a greater number of IO chiplets than other sectors of the plurality of sectors.

10. A programmable fabric main die, wherein one or more IO chiplets are stacked in a three-dimensional orientation above or below the programmable fabric main die, and wherein the programmable fabric main die comprises:
one or more die-to-die (D2D) drivers embedded within the programmable fabric main die, wherein the one or more D2D drivers interface with the one or more IO chiplets; and
a plurality of sectors associated with logic of the programmable fabric main die, wherein some sectors of the plurality of sectors are connected to a greater number of IO chiplets than other sectors of the plurality of sectors.

11. The programmable fabric main die of claim 10, wherein the one or more IO chiplets comprise IO drivers that are larger than the one or more D2D drivers.

12. The programmable fabric main die of claim 10, wherein the one or more D2D drivers are embedded into the programmable fabric main die in a vertical configuration in relation to vertical interconnection resources of the programmable fabric main die.

13. The programmable fabric main die of claim 10, wherein the one or more D2D drivers are embedded into the programmable fabric main die in a horizontal configuration in relation to vertical interconnection resources of the programmable fabric main die.

14. The programmable fabric main die of claim 10, wherein the one or more D2D drivers interface with the one or more IO chiplets via a plurality of microbumps or hybrid bonds.

15. An integrated circuit comprising:

one or more input/output (IO) chiplets;

a programmable fabric main die, wherein the one or more IO chiplets are stacked in a three-dimensional orientation above or below the programmable fabric main die, and wherein the programmable fabric main die comprises:

one or more die-to-die (D2D) drivers embedded within the programmable fabric main die, wherein the one or more D2D drivers interface with the one or more IO chiplets; and a plurality of sectors associated with logic of the programmable fabric main die, wherein a location of the one or more D2D drivers within a sector of the plurality of sectors of the programmable fabric main die is based on logic of the sector of the plurality of sectors.

16. The integrated circuit of claim 15, wherein the programmable fabric main die does not include IO resources within the programmable fabric main die.

17. The integrated circuit of claim 15, wherein the programmable fabric main die does include IO resources within the programmable fabric main die.

18. The integrated circuit of claim 15, wherein the one or more D2D drivers are less than 1.0 square microns in area.

19. The integrated circuit of claim 15, wherein the programmable fabric main die comprises a plurality of sectors associated with logic of the programmable fabric main die.

20. The integrated circuit of claim 19, wherein some sectors of the plurality of sectors are connected to a greater number of IO chiplets than other sectors of the plurality of sectors.

* * * * *